United States Patent [19]

Fried

[11] 4,086,544
[45] Apr. 25, 1978

[54] FREQUENCY SYNTHESIZER USING PHASE LOCKED LOOPS

[75] Inventor: Raymond L. Fried, Lynnwood, Wash.

[73] Assignee: John Fluke Mfg. Co., Inc., Mountlake Terrace, Wash.

[21] Appl. No.: 262,076

[22] Filed: Jun. 12, 1972

[51] Int. Cl.² ............................................. H03B 19/00
[52] U.S. Cl. ........................................ 331/1 A; 331/2; 331/18; 328/14
[58] Field of Search ................... 331/2, 51, 1 A, 19, 331/18, 25; 328/14

[56] References Cited

U.S. PATENT DOCUMENTS

| | | | |
|---|---|---|---|
| 3,202,930 | 8/1965 | Muraszko | 331/2 |
| 3,208,005 | 9/1965 | Guttman et al. | 331/19 |
| 3,229,219 | 1/1966 | Berman | 331/2 |
| 3,268,831 | 8/1966 | Noordanus et al. | 331/2 |
| 3,293,561 | 12/1966 | Hegarty et al. | 331/51 |
| 3,319,178 | 5/1967 | Broadhead, Jr. | 331/2 |
| 3,372,339 | 3/1968 | Harrison et al. | 331/1 A |
| 3,372,346 | 3/1968 | Rogers et al. | 331/2 |
| 3,435,367 | 3/1969 | Little, Jr. | 331/2 |
| 3,479,610 | 11/1969 | Wicker | 331/2 |
| 3,551,826 | 12/1970 | Sepe | 331/1 A |
| 3,657,664 | 4/1972 | Brack | 331/1 A |

Primary Examiner—John S. Heyman
Attorney, Agent, or Firm—Christensen, O'Connor, Johnson & Kindness

[57] ABSTRACT

A frequency synthesizer utilizing a series of individual frequency generating circuits, each circuit containing two phase locked loops, the operation of the loops being under the control of a computer which translates the value of the desired frequency into specific digital commands for the individual circuits. In conjunction with this series of frequency generating circuits is a divider network to which the output of the last frequency generating circuit is applied. The divider network utilizes the generated range of frequencies either directly, routing them to the output, or divides the applied frequency, depending on the particular frequency to be supplied at the output.

13 Claims, 7 Drawing Figures

FREQUENCY SYNTHESIZER USING PHASE LOCKED LOOPS

BACKGROUND OF THE INVENTION

This invention relates generally to the art of frequency synthesization, and more particularly, to the art of utilizing phase locked loops for frequency synthesis.

Discrete frequency generation and synthesis have long been important in the electrical arts. As electronic technology has become more sophisticated, frequency synthesizers, which "build" desired frequencies in several steps, have also become sophisticated and complex, particularly where frequency stability and resolution are important. In general, there is a continuing need for frequency synthesizers having reduced noise characteristics, improved resolution, particularly at the lower frequencies, and increased sensitivity, all to be achieved at minimum cost. The phenomenon of spurious signals and other noise in frequency snythesizers is very important and is a significant drawback of the prior art. The introduction of noise into a synthesizer will vary in its effect, depending upon the point at which the noise occurs. At the output, however, the noise will degrade performance, set effective power limits, and will require specialized circuitry to minimize its effects. In addition to the problem of noise, current synthesizer techniques often require internal frequencies of 6 to 10 times the highest output frequency, thereby increasing the complexity and cost of the synthesizer to achieve adequate resolution and control.

The prior art frequently makes use of mixer devices to achieve a specific range of output frequencies. The use of mixers in the final stages require high (as compared to the output) internal frequencies and frequently is a source of noise, thereby reducing resolution of the entire system.

Furthermore, the prior art which utilizes phase locked loops, such as shown by the patent to Muraszko, U.S. Pat. No. 3,202,930, and the patent to Hoo, U.S. Pat. No. 3,379,992 have disadvantages because of range and resolution limitations. Both of these patents, although eliminating the output mixer, are restricted in their range and the control over the output. Utilizing the techniques disclosed in these patents to cover a frequency range of close to 100 MHz, with a 1 Hz resolution would require a great number of phase locked loop circuits and additional control circuitry.

In view of the background of the invention described above, an object of the present invention is to provide a frequency synthesizer utilizing phase locked loops having a wide range of output frequencies.

It is another object of the present invention to provide a frequency synthesizer having a high resolution of output frequencies.

It is a further object of the present invention to provide a frequency synthesizer in which the highest output frequency is not significantly less than the highest frequency produced with the synthesizer.

It is a still further object of the present invention to provide a frequency synthesizer having a plurality of individually controlled frequency circuits, each circuit being relatively independent of each other.

Other and futher objects, features and advantages of the present invention will become apparent as the description proceeds.

SUMMARY OF THE INVENTION

Briefly, in accordance with a preferred embodiment, the present invention includes a source of at least one standard frequency, a series of synthesizer circuits, said circuits including first and second phase locked loops, a control means connected to the phase locked loops, which locks the loops to a predetermined frequency, and a divider for dividing the output of the last of the series of phase locked loops.

DESCRIPTION OF THE DRAWINGS

A more thorough understanding of the invention may be obtained by a study of the following detailed description taken in connection with the accompanying drawings in which.

DESCRIPTION OF THE PREFERRED EMBODIMENT

Figure 1:
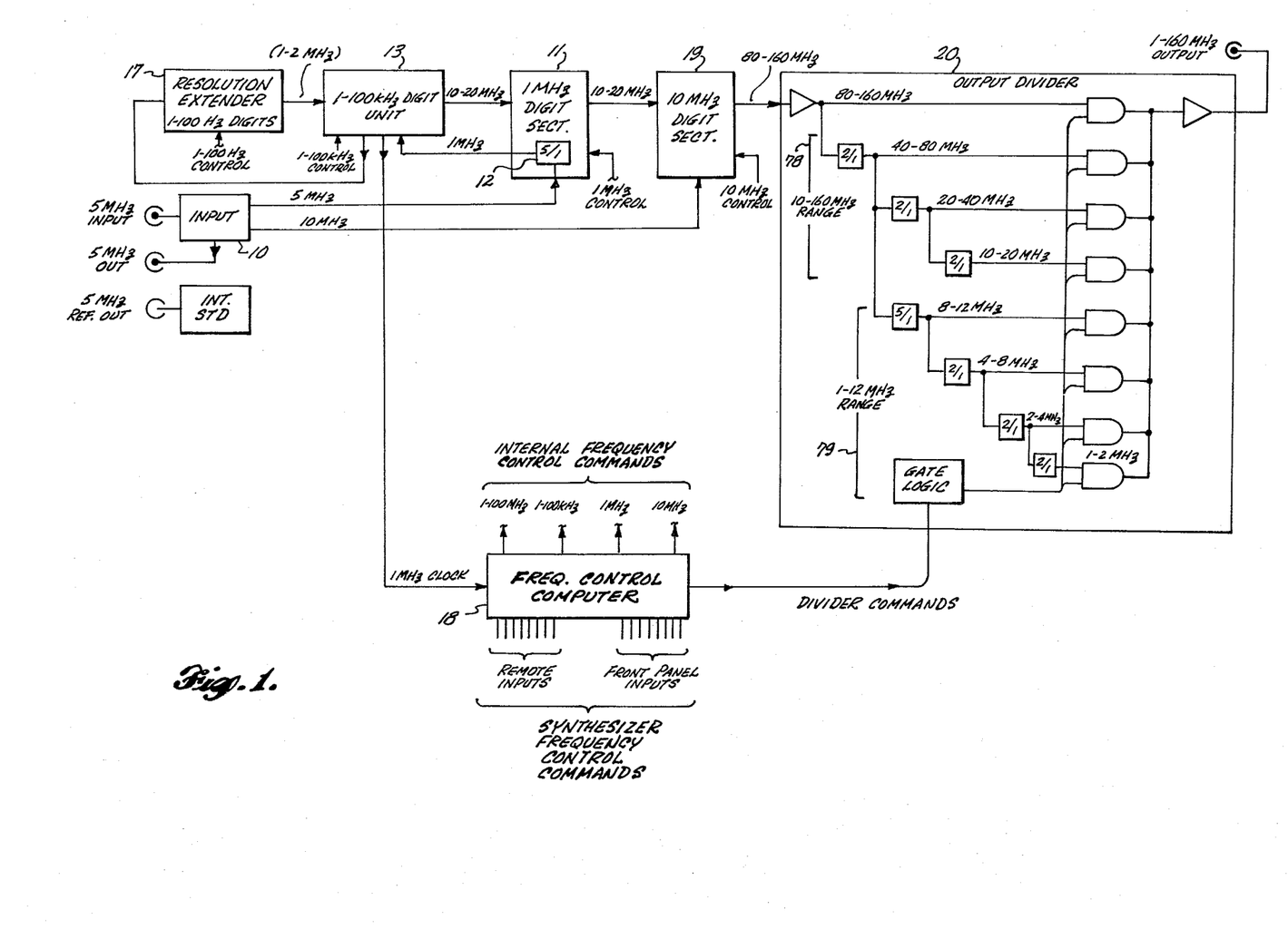
FIG. 1 is a simplified block diagram of the present invention.

Referring now to FIG. 1, there is shown a simplified block diagram of the present invention. It consists of seven principal circuits, each one of which will be discussed in more detail as the description proceeds. The invention utilizes a 5 MHz reference signal to produce an output signal having a frequency range 1-160 MHz with a resolution of 1 Hz. The 5 MHz reference signal may be supplied either externally or internally by a stable frequency source. This standard signal is then applied to an input filter circuit 10 which produces two 5 MHz signals and a 10 MHz signal. One of the 5 MHz signals is made available as a standardized output. The other 5 MHz signal is used as a standard frequency input to the 1 MHz digit circuit 11. A 5/1 divider 12 in this circuit divides the 5 MHz signal down to a 1 MHz signal, which is the reference frequency for the 1-100 kHz circuit 13, which consists of a 1 kHz digit circuit, a 10 kHz digit circuit, and a 100 kHz digit circuit. The 1 MHz signal is also used as a standard for the resolution extender 17, and the frequency control computer 18. The 10 MHz signal is used as the frequency standard for the 10 MHz digit circuit 19.

The individual digit circuits, and the resolution extender circuit, are comprised of phase locked loops, under the control of digital commands from the frequency control computer, which translates a desired frequency selected by the operator into control commands appropriate for each digit circuit. The digit circuits are serially connected, so that the desired frequency is synthesized by adding the output of an individual circuit to the output of an individual circuit to the succeeding stage. This addition and synthesization continues until a predetermined frequency is reached. The output divider 20 receives the result of the 10 MHz digit circuit, the signals ranging in frequency from 80 to 160 MHz. If the desired output frequency selected by the operator is between 80 and 160 MHz, the output of the 10 MHz section is buffered and applied directly to the synthesizer output. However, if the desired frequency is less than 80 MHz, it is necessary to divide the output of the 10 MHz digit circuit to the desired frequency. The particular divider circuit used in each case is determined by the frequency control computer, depending on the value of the desired output frequency.

Figure 2A:
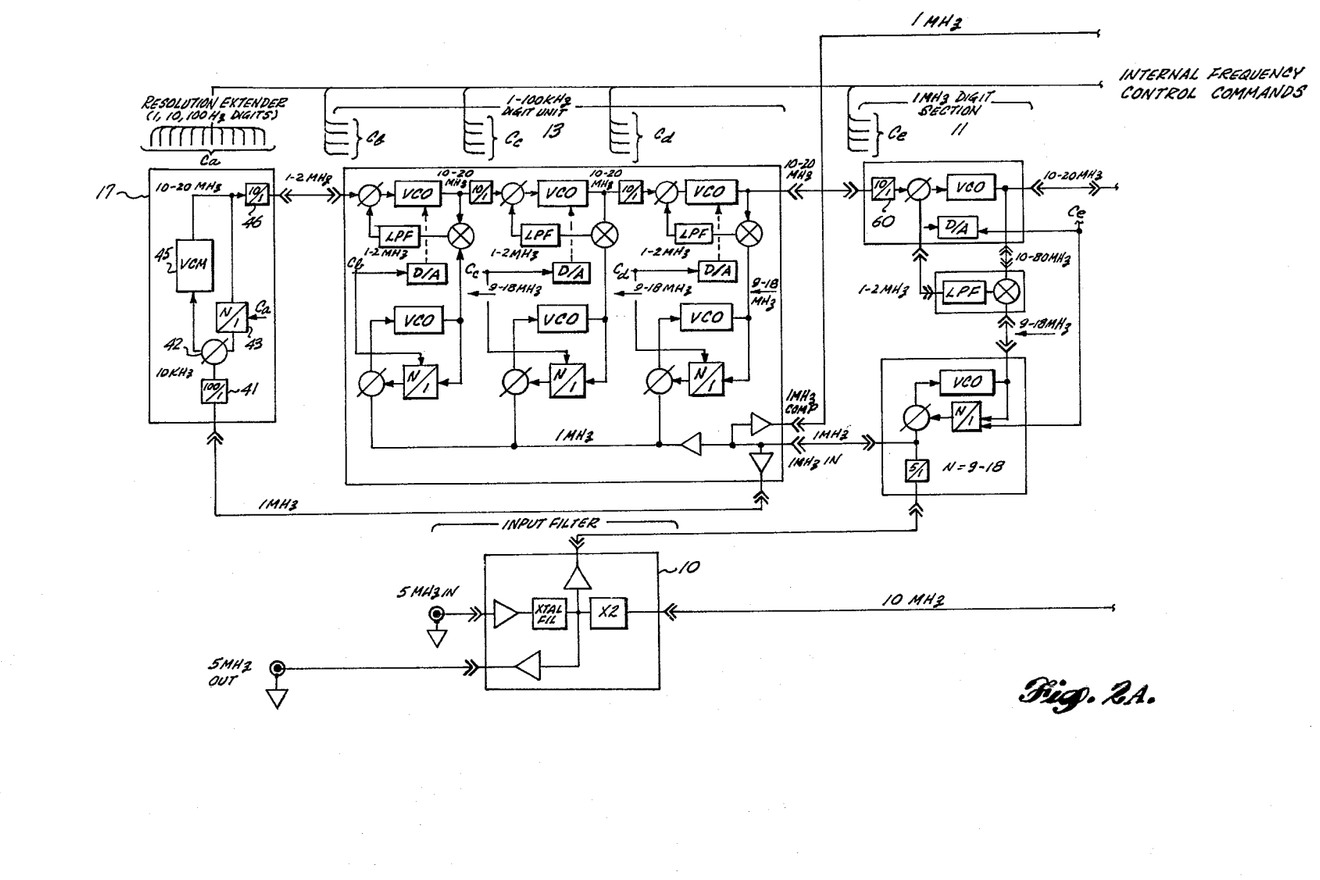
FIG. 2a and 2b are detailed block diagrams of the present invention.
Figure 2B:
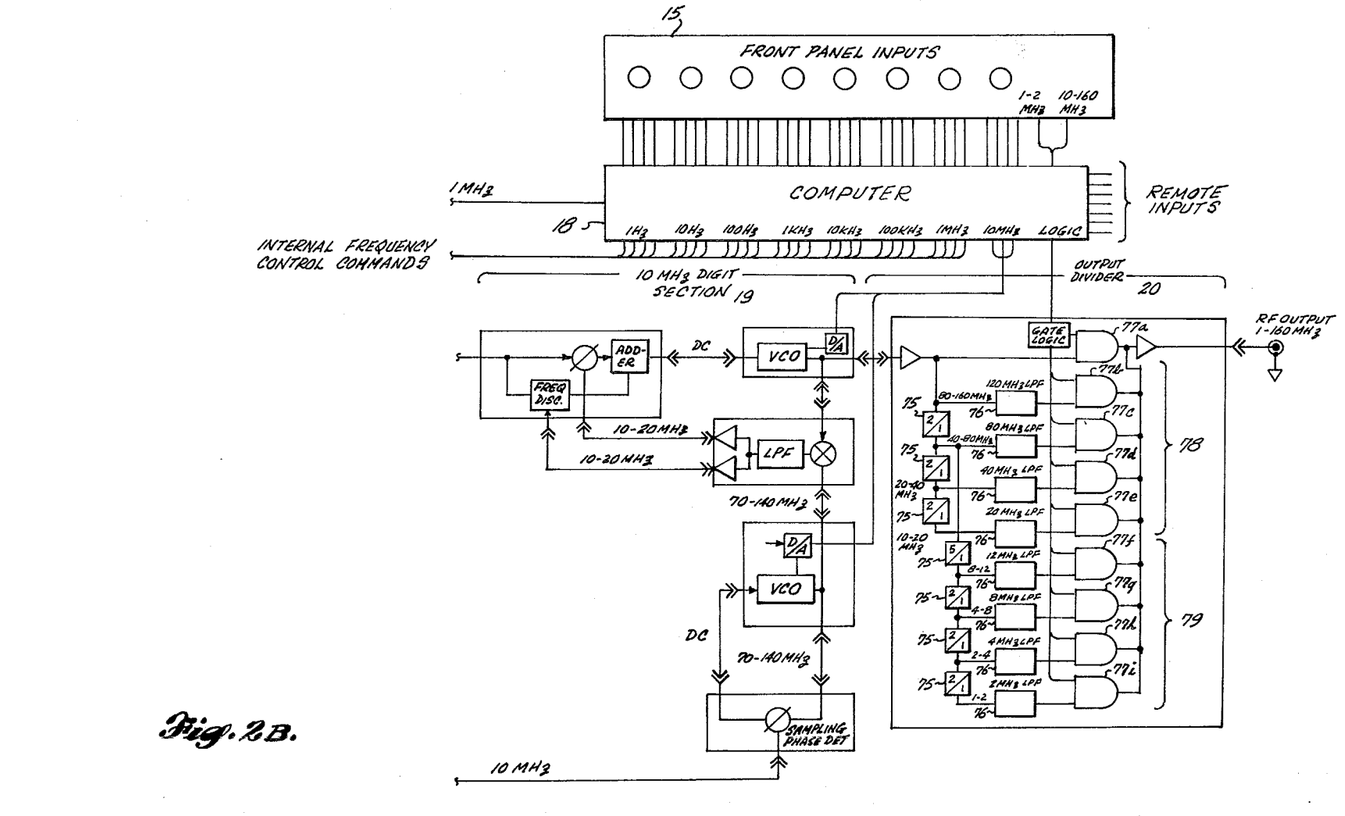

In reference now to FIG. 2, a more detailed block diagram of the present invention is shown. The operator initially selects the desired frequency, including the range (1–12 MHz or 10–160 MHz), by manipulating the controls 15 and the selection is applied to the frequency control computer 18. The computer logically recognizes the preselected frequency and selects the appropriate divider network in the output divider 20, if division is necessary (less than 80 MHz). For example, if the preselected frequency is 100 MHz, no divider network is selected by the computer, because this frequency is synthesized directly by the digit circuits. However, if the operator selects a frequency of less than 80 MHz, i.e., 16.862717 MHz, the frequency control computer will select the 10–20 MHz divider network. In the 10–160 MHz range, the 10–20 MHz divider network has three 2/1 dividers between the 10 MHz digit output and the synthesizer output. If the 10–20 MHz divider network is enabled, the snythesizer output will be ⅛ of the output of the 10 MHz digit circuit 19. Thus, for a synthesizer output frequency of 16.862717, it is necessary to have an output of the 10 MHz digit circuit of 134.901736 MHz (8 times 16.862717 MHz). Once the output of the 10 MHz digit circuit is established, the computer frequency commands can be generated and sent to the individual circuits. In the above example, the computer will command the digit circuits to produce a frequency of 134.901736 MHz, digit by digit. Thus, the resolution extender circuit, having a range of 0–1 kHz, a command of 736, appropriate for its range in accordance with the desired frequency. Accordingly, the 1 kHz digit section will receive a command of "1," the 10 kHz section will receive a "0" command, the 100 kHz section will receive a "9" command, the 1 MHz digit section will receive a command of "4", and the 10 MHz digit section will receive a command of 5, which is associated with the output range of 130–140 MHz. These individual commands, addressed to the appropriate digit circuits, control the operation of the phase locked loops in each circuit so that the 10 MHz digit circuit produces a signal of 134.901736 MHz. The signal is then applied to the output divider circuit 20, and since, as was explained earlier, the 10–20 MHz divider network is enabled, the output of the 10 MHz digit circuit will be divided by 8, resulting in the desired frequency of 16.862717 MHz. The operation of each major circuit in the present invention will be explained in more detail in the following paragraphs.

Figure 4:
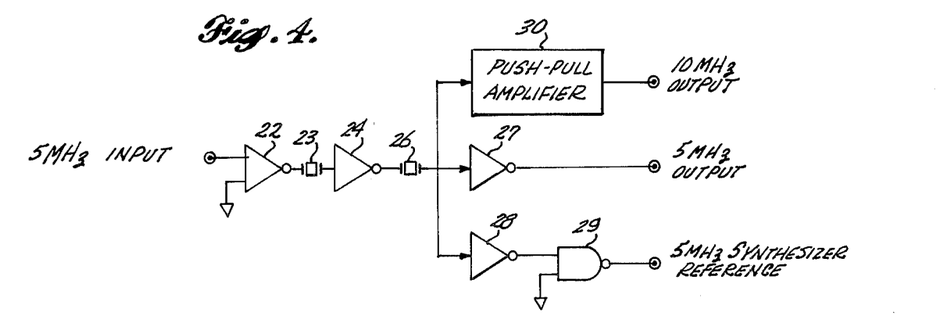
FIG. 4 is a block diagram of the input filter circuit of the invention.

Referring to FIG. 4, the input filter circuit processes the 5 MHz standard input signal, and produces two 5 MHz outputs and a 10 MHz output. The 5 MHz input is applied to the tuned amplifier 22. It is then filtered 23, amplified again 24, and again filtered 26. The signal is then split in three directions, one signal being amplified 27 and utilized as a 5 MHz synthesizer output. A 5 MHz signal is also applied to amplifier 28, then to Nand gate 29 to produce the standard 5 MHz signal used for system frequency reference. Additionally, a 5 MHz signal is multiplied by a push-pull amplifier 30 producing a 10 MHz output, which is then applied to the 10 MHz digit circuit as its reference frequency.

Figure 3:
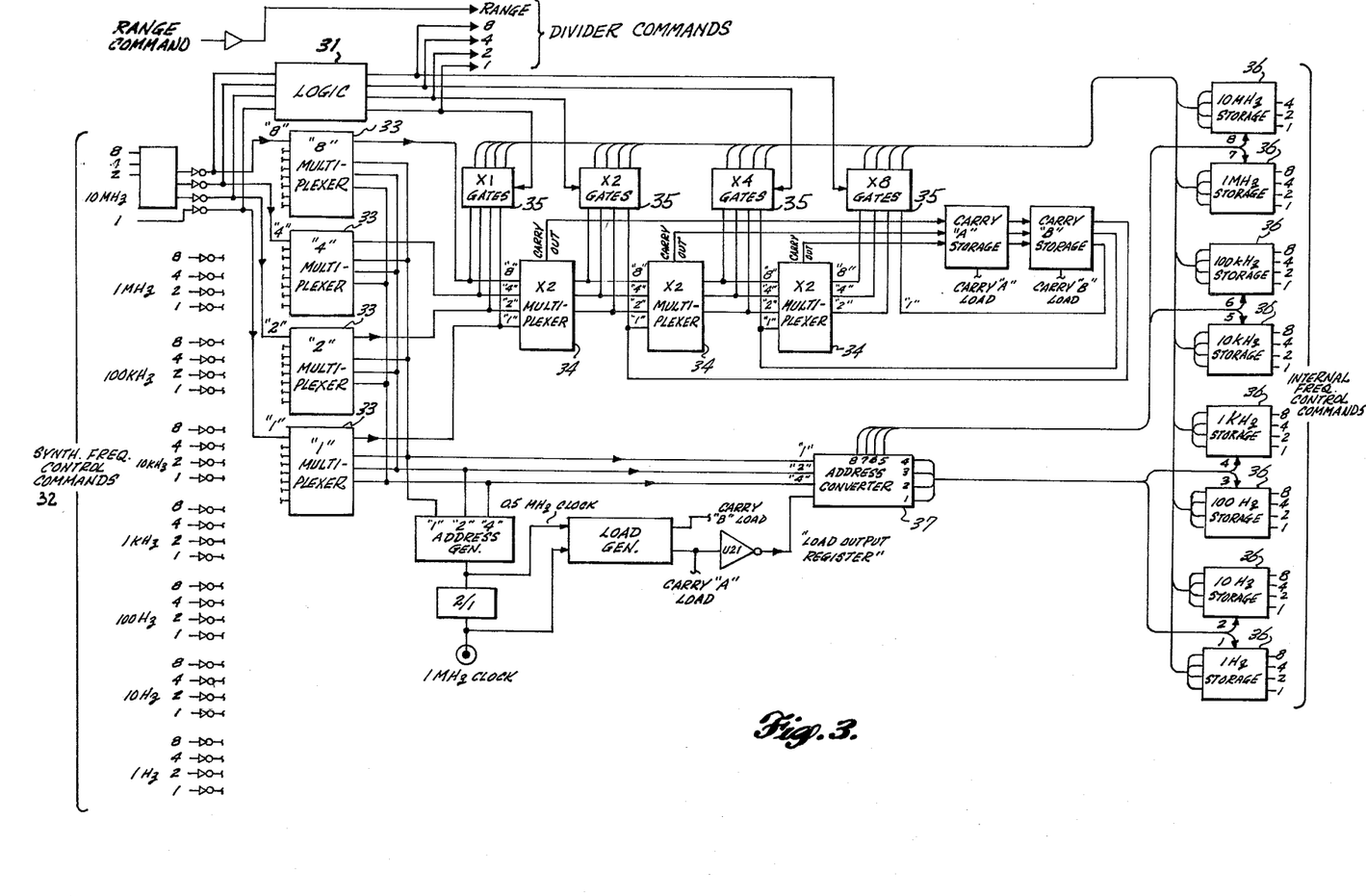
FIG. 3 is a block diagram of the computer assembly of the invention.

Referring to FIG. 3, the frequency control computer receives input commands and converts them to internal frequency control commands for the digit circuits and the output divider. The input to the frequency control computer (desired frequency) may be made either at the machine, or remotely, through the remote terminal. Initially, the logic section 31 of the computer decodes the information contained in the 10 MHz portion of the desired frequency selected by the operator, and determines what division will be necessary, if any. Through the use of standard and well-known logic techniques, the computer recognizes the value of the 10 MHz portion of the desired signal and then enables the appropriate output divider network, if the desired output signal is less than 80 MHz. If it is not necessary to divide the signal, (the desired frequency is greater than 80 MHz) none of the divider networks are enabled, and the desired signal may be synthesized directly. At the same time, the complete digital word 32 representing the desired output frequency is applied to the computer. This "word" is applied in parallel fashion, as shown in FIG. 3. A series of multiplexers 33—33 combines the parallel signal in a serial decade fashion, starting with the 1 Hz portion and ending with the 10 MHz signal. This serial signal is then multiplied by each one of the 2/1 multipliers 34—34 and sent to the gates 35—35. The output of these gates is the control commands sent to the individual digit circuits. The logic circuit 31 which enables the appropriate divider network also enables the appropriate gate associated with the selected divider network. Thus, for example, if the 10 to 20 MHz divider network is the appropriate divider network (the output signal is between 10 and 20 MHz) the 8/1 gate is selected, as the signal appearing at the output of the 10 MHz circuit must have a frequency 8 times that of the eventual output, and the control commands to the individual digit circuits must correspond to the frequency of the 10 MHz circuit. In effect, the desired input signal has now been multiplied in frequency by 8. The serial signal is then loaded into individual storage devices 36—36, under the control of the address converter 37. The serial signal is, in effect, demultiplexed, and each storage unit has the information for one significant digit of the 10 MHz circuit output frequency. The data in the storage device is thus some multiple of the selected desired frequency and equal to the output of the 10 MHz digit circuit on a digit by digit basis (except for the 10 MHz digit, which has a special nomenclature). This data is then presented to the individual digit circuits as control commands.

FIG. 2a shows the resolution extender circuit 17, which provides 1–999 Hz frequency increments in the 10–160 MHz range. The 1 MHz reference signal is initially divided down by a 100 to 1 divider 41 to 10 kHz. This 10 kHz signal is the reference signal for the operation of the single phase locked loop of this circuit. The 10 kHz signal is one input to a phase detector 42, the other input coming from an $n/1$ divider 43 which has a division factor dependent upon the frequency control command issued by the computer 18. The actual value of $n$ is the value of the frequency command from the computer plus an absolute value of 1,000, thus giving a range of $n$ from 1,000 to 1,999, corresponding to the 000 through 999 Hz frequency commands of the computer.

The output of the standard phase detector 42 is a DC control voltage which is applied to a voltage controlled multivibrator (VCM) 45. The frequency range of the free-running multivibrator is 10 to 20 MHz. The output of the VCM is applied to both a 10 to 1 divider 46 for application to the succeeding digit circuit, and also to the n/1 divider 43. The phase locked loop operates in such a fashion that the VCM produces a 10.00 through 19.99 MHz signal, which corresponds to the 000 through 999 Hz frequency computer commands. Thus, if the frequency computer command is 736, corresponding to a 10 MHz digit circuit output of 736 in the 000–999 Hz portion, the n/1 divider will divide the output of the VCM by 1736. This output will then be compared with the 10 kHz standard frequency in the phase detector and any difference (indicated by a control voltage) will be applied to the VCM again.

The loop will eventually stabilize in the example at 17.36 MHz. If the output of the VCM is 17.36 MHz, it will subsequently be divided down by the n/1 divider (1736), resulting in an output of the n/1 divider of 10 kHz. This is exactly equal to the reference signal, and hence, no DC error voltage will result from the phase detector. The loop will thus stabilize at this particular frequency. Since the output of the VCM is divided by 10 by the divider 46, the input to the following stage is 1.736 MHz.

Figure 5:
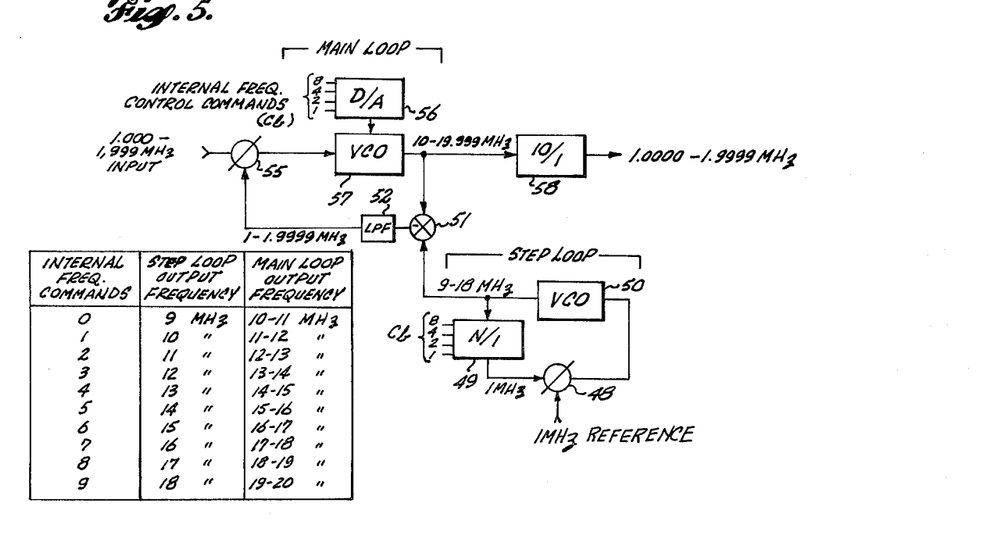
FIG. 5 is a block diagram of the 1 kHz digit circuit of the invention.

The next major circuit following the resolution extender circuit is the 1 to 100 kHz digit circuit, as shown in FIG. 1. However, the 1 to 100 kHz circuit is made up of three identical digit circuits (1 kHz, 10 kHz, 100 kHz) as shown in FIG. 2. Since the operation of each of these digit circuits is identical, only the 1 kHz digit unit circuit will be fully explained. Referring to FIG. 5, the 1 MHz signal is utilized as the circuit reference signal. The 1 MHz reference input is a first input to phase detector 48 of a first phase locked loop (step loop). A second input comes from the n/1 divider 49 which receives the frequency commands from the frequency control computer associated with the 1 kHz digit of the frequency to be synthesized.

The output of the phase detector which depends on the frequency difference between the two inputs is then applied as an input to a voltage controlled oscillator 50, the output of which is applied to the n/1 divider 49 and to the mixer 51 of a second phase locked loop (main loop). The step loop is locked to the frequency commands produced by the frequency control computer. As shown by the accompanying chart in FIG. 5, the individual frequency commands from the computer will result in specific output frequencies of both the step loop and the main loop. For instance, if the 1 kHz digit command is a 1, the n/1 divider 49 divides the output of the VCO 50 by 10. The divider 49 has a division range of between 9 and 18, corresponding to the computer control commands of between 0 and 9. In the example, given a control command of 1, the division factor of the n/1 divider would be 10. As is clear from the chart, a division factor of 10 (associated with a frequency command of 1) will result in the step loop being locked to a VCO frequency of 10 MHz. The 10 MHz signal from the step loop is applied to a mixer 51, the output of which is applied to a low-pass filter 52. The signal is applied as a first input to a phase detector 55. A second input is the output of the preceding digit circuit (in this case, 1.76 MHz from the resolution extender circuit). The digital-to-analog converter 56, receives the control command from the frequency control computer which presteers the VCO 57 to near the desired frequency.

The output of the VCO 57 is applied to a second input to the mixer 51. The overall range of the VCO 57 is again from 10 to 20 MHz, and in this case, the VCO loop will stabilize at a frequency of 11.736 MHz. At this frequency, the output of the mixer 51 will be 1.736 MHz (11.736−10) which is the input from the previous stage, and hence, there will be no error output from the phase detector 55, resulting in the main loop being locked to a frequency of 11.736 MHz. This signal is applied to a 10 to 1 divider 58 and the resulting output will be 1.1736 MHz.

The 1 kHz digit unit has thus added or snythesized an additional digit in the desired output signal. It is this process of stage-by-stage synthesization and addition under the control of frequency commands from a computer which eventually accomplish the desired results. The operation of the 10 kHz digit circuit, and the 100 kHz digit circuit, are identical to the operation of the 1 kHz digit circuit just described. Thus, in the example, the output of the 10 kHz digit circuit would be 1.01736 MHz, and the output of the 100 kHz digit circuit would be 19.01736 MHz (not yet divided).

The output of the 100 kHz digit circuit is then applied to a 1 MHz digit circuit, the operation of which is nearly identical to the previously described digit circuits, but which has a slightly different physical orientation. For instance, while the entire 1 to 100 kHz digit circuit, (1 kHz, 10 kHz, 100 kHz digit circuits) are all positioned on one module, the 1 MHz digit section is positioned on three modules as shown in FIG. 2a. The 10 to 20 MHz signal from the 100 kHz digit circuit is divided down by 10 by the divider 60. The 1 MHz digit circuit then processes the signals, the output of the 1 MHz in a similar fashion to that of the 1–100 kHz circuits, and provides an output of between 10–20 MHz, undivided, to the 10 MHz digit circuit.

Referring again to the example, the output of the 1 MHz digit circuit will be 14.90173 MHz.

Figure 6:
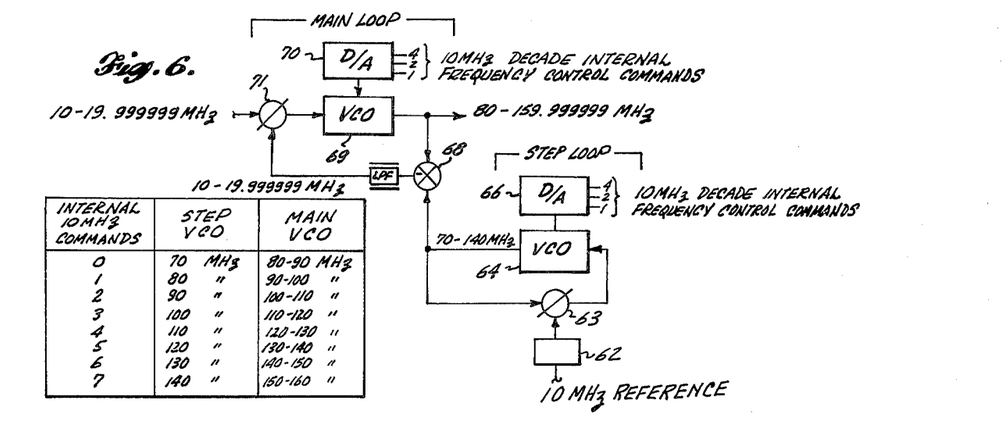
FIG. 6 is a block diagram of the 10 MHz digit circuit of the invention.

This signal is applied to the 10 MHz digit circuit, which is the last digit circuit utilized in the present invention. Referring to FIG. 6, the 10 MHz digit circuit utilizes, as do the previous digit circuits, a step loop in combination with a main loop to produce a stable output frequency. However, there are sufficient variations to warrant a more detailed explanation. As stated previously, the 10 MHz digit circuit utilizes a 10 MHz reference frequency. This frequency is first applied to a harmonic generator 62, the signal output of which is applied as one input to the phase detector 63. The other input to the phase detector 63, as distinguished from the other circuits, is the output of the voltage controlled oscillator 64. The harmonic generator 62 creates a range of frequencies from 10 MHz to 180 MHz in 10 MHz increments (10, 20, 30, . . . 180). The output of the phase detector 63, which is a DC control voltage, is proportional to the difference in frequency between the two inputs and is applied to the voltage controlled oscillator 64. The VCO is initially presteered to near the proper frequency by the D/A converter 66, which has received the proper command from the frequency control computer. The loop will then lock to the nearest 10 MHz harmonic (from the generator 62). Referring to the example, the desired output of the 10 MHz section is 130–140 MHz including the input signal (14.90173 MHz) from the previous sections. Referring to the chart in FIG. 6, a control command of 5 corresponds to an output in the frequency range of 130–140 MHz.

The logic circuitry in the computer recognizes (as previously explained) that a 130 to 140 MHz range frequency will be the required 10 MHz circuit output, for a desired frequency of 16.862717 MHz and supplies the appropriate command to the D/A converter 66, to presteer the VCO 64 to a frequency close to 120 MHz. Unlike the previous digit circuits, the control commands for the 10 MHz digit circuit range from 0 through 7, and the output of the 10 MHz circuit is 80-160 MHz. The table of control commands, and their associated step and main loop frequency ranges are shown in FIG. 6. Again, referring to the example, a command of 5 from the frequency control computer to the D/A converter 66 will initially steer the operation of the VCO 64 close to a step loop frequency of 120 MHz. The 120 MHz output will be used as a first input to the phase detector 63, while the second input to the phase detect will be a 120 MHz signal produced by the harmonic generator 62. Any difference between the two input frequencies will result in a proportional DC control voltage. This control voltage will lock the VCO and the loop to a precise frequency of 120 MHz. The use of the harmonic generator, with the pre-steering of the control commands, results in an output range of the step loop of 70-140 MHz, in 10 MHz steps.

The output of the step loop (70-140 MHz) is then applied as one input to the subtractive mixer 68. The other input to the subtractive mixer is the output of the VCO 69, which has been presteered to close to the selected frequency by the D/A converter 70, under the commands of the frequency control computer. In the example, the VCO 69 will be initially steered to a frequency in the range of 130 to 140 MHz. The frequency difference between this initial frequency of the VCO 69 and the step loop frequency will be the output frequency of the subtractive mixer 68. The difference between the two frequencies will always be between 10 and 20 MHz. This signal is applied as one input to the phase detector 71. The signal from the preceding 1 MHz digit circuit is the other input. Any difference between these two signals will result in a proportional DC control voltage to the VCO 69, which will adjust the frequency of the VCO 69. In the example, a VCO frequency of 134.901736 MHz will lock the loop. The output of the mixer 68 will be 134.901736 − 120 = 14.901736 MHz. This signal is applied to the phase detector 71, the other input of which (the output of the 1 MHz circuit) is also 14.901736 MHz. This balance results in a zero D.C. error voltage, a condition of locking the loop. The synthesis of the desired 10 MHz frequency output is now complete.

The last major circuit in the present invention is the output divider, shown in FIG. 2b. The output divider receives the output of the 10 MHz digit circuit (80 to 159.999999 MHz) and through a binary division process, produces the final 1 to 159.999999 MHz output signal. As can be seen from FIG. 2b, the output divider is made up of a series of standard binary dividers 75—75, in combination with low-pass filters 76—76, and associated gates 77a–77i. As explained previously, a synthesizer output signal with a frequency between 80 and 160 MHz may be applied directly from the output of the 10 MHz digit circuit to the synthesizer output. If the synthesizer output is to be less than 80 MHz, the output divider must be used.

In the present invention, there are two divider ranges, one range 78 covering the range of 10 to 160 MHz (gates 77a–77e) although only signals which must be less than 80 MHz are actually divided, and the other range 79 covering the range of 1 to 12 MHz gates 77f–77i. The 10 to 160 MHz range contains three 2 to 1 dividers with associated low-pass filters and gates. As was mentioned earlier, the appropriate divider network (a specific gate, with its associated low-pass filter, and preceding binary dividers) for a desired output frequency is selected and enabled by the logic circuitry in the frequency control computer. In the example, the desired output frequency was between 10 and 20 MHz, so gate 77e was enabled. The output signal from the 10 MHz digit circuit is thus divided by 8 (the signal passes through three 2/1 dividers) before reaching gate 77e, where it is applied to the synthesizer output. More specifically, the output of the 10 MHz digit circuit is 134.901736 MHz. Dividing that frequency by 8, the synthesizer output frequency is 16.862717 MHz, which is the frequency originally selected as the desired output.

The 1 to 12 MHz divider range operates identically to the 10 to 80 MHz section. It consists of five digital dividers, with associated low-pass filters and gates. As shown in FIG. 2b, the output of the 10 MHz circuit is first divided by 2, then by 5, then by 2, again by 2, and again by 2. This range covers the frequency range of 1–12 MHz with a resolution of 0.1 Hz.

The synthesizer thus utilizes the output of the 10 MHz digit circuit to provide an output of 1–160 MHz, the output divider being used for those frequencies between 1 and 80 MHz.

Although a preferred embodiment of the invention has been disclosed herein for purposes of illustration, it will be understood that various changes, modifications, and substitutions may be incorporated in such embodiment without departing from the spirit of the invention as defined by the claims which follow.

What is claimed is:

1. A frequency synthesizing system, comprising:
   frequency synthesizing means operative to produce an adjustable intermediate frequency;
   frequency dividing means connected to receive the intermediate frequency and to divide it by an adjustable division factor to produce an output frequency;
   setting means operable to set up a desired value of the output frequency; and
   control means connected to the setting means to respond to the value of the output frequency set up thereby and also connected to the synthesizing means and the dividing means to control the values of the said intermediate frequency and of the division factor in dependence on the value of the output frequency set up, such that the value of intermediate frequency produces, when divided by the division factor of the dividing means, the desired output frequency.

2. A system according to claim 1, in which the control means comprises:
   selecting means operative to produce, for each desired value of the output frequency set up by the setting means, a different and predetermined first control output representing a particular value of division factor,
   multiplying means connected to the setting means and the selecting means and operative to multiply the desired value of the output frequency set up by the setting means and the first control output to produce a second control output,
   means feeding the first control output to the dividing means to set the division factor thereof, and means feeding the second control output to the frequency synthesizing means to set the value of the said intermediate frequency.

3. A system according to claim 2, in which the dividing means comprises means operative to divide the intermediate frequency by a division factor of $X^x$, where X is a fixed integer, and $x$ is an integer which is varied in dependence on the value of the first control output whereby to vary the value of the division factor.

4. A system according to claim 3, in which the dividing means comprises means for dividing the intermediate frequency by an additional factor of $Y^y$ where Y is a fixed integer, and $y$ is an integer which is manually variable to alter the range of the output frequency.

5. A system according to claim 2, in which the dividing means comprises means operative to divide the intermediate frequency by a division factor of $X^x.Y^y$, where X and Y are fixed integers and $x$ and $y$ are integers which are varied in dependence on the value of the first control output, whereby to vary the value of the division factor.

6. A system according to claim 5, in which X is 2 and Y is 10.

7. A synthesizing system according to claim 1, wherein said frequency synthesizing means includes a plurality of digit circuits, said digit circuits being connected in a serial fashion to produce said intermediate frequency.

8. A snythesizing system according to claim 7, wherein each of said plurality of digit circuits further includes first and second phase-locked loops.

9. An apparatus according to claim 8, wherein each of said first phase-locked loops includes a first means for generating frequencies, first means for detecting a difference in frequency between two signals, said first detecting means having an output voltage proportional to said frequency difference, which output voltage is applied to said first frequency generating means, and a first dividing means connected to said first detecting means and said first frequency generating means and controlled by said control means for phase locking said first phase-locked loop.

10. An apparatus according to cliam 9, wherein said frequency generating means of said first phase-locked loop is connected to said second phase-locked loop in each of said plurality of digit circuits.

11. An apparatus according to claim 10, wherein each of said second phase-locked loops includes means for mixing two input frequencies, the frequency of the output of said mixer being the difference betweeen said two input frequencies, and further includes a second means for generating frequencies, a second means for detecting a difference in frequency between first and second signals connected to said mixer means and said second frequency generating means, said second detecting means having a voltage output proportional to the frequency difference between said first and second signals.

12. An apparatus according to claim 1, wherein said control means includes a multiplexer for converting a frequency value set on said setting means to a serial, decade-by-decade signal, a plurality of multipliers connected to said multiplexer for multiplying said serial signal, a plurality of gating means connected to said multipliers for passing selected outputs of said multiplier means, and a plurality of storage means connected to said plurality of gating means for storing, in parallel fashion, said passed selected outputs, each digit circuit having an associated storage means.

13. An apparatus in accordance with claim 12, wherein said dividing means comprises a plurality of divider networks, each of said plurality of divider networks including a binary divider, a low-pass filter, connected to said binary divider, an output gate connected to said filter and actuated by said control means, said control means further including means for selecting a specific divider network such that said intermediate frequency is divided down to set frequency value.

* * * * *